United States Patent [19]

deBoer et al.

[11] Patent Number: 4,993,355

[45] Date of Patent: * Feb. 19, 1991

[54] SUSCEPTOR WITH TEMPERATURE SENSING DEVICE

[75] Inventors: Wiebe B. deBoer, GB Eersel, Netherlands; Albert E. Ozias, Aumsville, Oreg.

[73] Assignee: Epsilon Technology, Inc., Phoenix, Ariz.

[*] Notice: The portion of the term of this patent subsequent to Aug. 18, 2006 has been disclaimed.

[21] Appl. No.: 339,310

[22] Filed: Apr. 17, 1989

Related U.S. Application Data

[63] Continuation of Ser. No. 32,474, Mar. 31, 1987, Pat. No. 4,821,674.

[51] Int. Cl.$^5$ .............. B05C 11/00; B05C 13/00; C23C 16/52
[52] U.S. Cl. .................. 118/641; 118/666; 118/696; 118/730; 427/55
[58] Field of Search .............. 118/666, 641, 696, 728, 118/729, 730, 500; 427/72, 70, 55

[56] References Cited

U.S. PATENT DOCUMENTS

| 4,100,879 | 7/1978 | Goldin et al. | 118/730 |
| 4,313,266 | 2/1982 | Tam | 34/8 |
| 4,403,567 | 9/1983 | deCosta et al. | 118/730 |
| 4,498,833 | 2/1985 | Hertel | 118/729 |
| 4,654,509 | 3/1987 | Robinson et al. | 219/405 |
| 4,714,594 | 12/1987 | Mircea | 118/730 |
| 4,789,771 | 12/1988 | Robinson et al. | 118/730 |
| 4,839,145 | 6/1989 | Crale et al. | 118/730 |

FOREIGN PATENT DOCUMENTS

| 58-106543 | 6/1983 | Japan | 118/730 |
| 60-189927 | 9/1985 | Japan | 118/730 |
| 61-214520 | 9/1986 | Japan | 118/730 |
| 2181458 | 4/1987 | United Kingdom | 118/730 |

Primary Examiner—Jay H. Woo
Assistant Examiner—Khanh P. Nguyen
Attorney, Agent, or Firm—Cahill, Sutton & Thomas

[57] ABSTRACT

A rotatable substrate supporting mechanism for use in a chemical vapor deposition reaction chamber of the type used in producing semi-conductor devices is provided with a susceptor for supporting a single substrate, or wafer, for rotation about an axis normal to the center of the wafer. The mechanism is provided with a temperature sensing system for producing signals indicative of sensed temperatures taken at the center of the susceptor and at various points about the periphery thereof. A gas purging system is provided for inhibiting the flow of reactant gas in unwanted areas of the reaction chamber and in the supporting system itself. Rotational driving of the mechanism is accomplished by a variable speed motor under control of a circuit which stops and starts the rotation at controlled speeds and stops the rotation at a home position for enhancing the handling of the wafers.

6 Claims, 8 Drawing Sheets

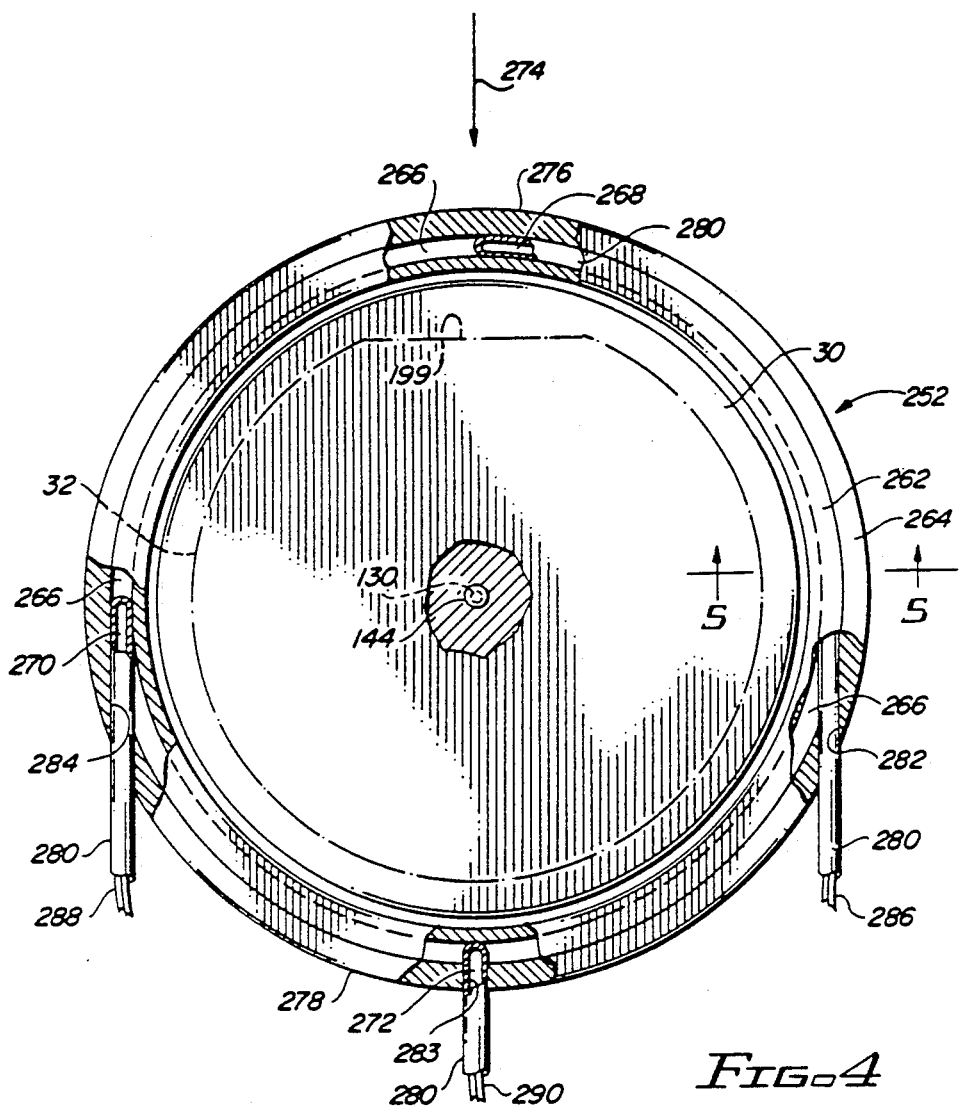
FIG. 4
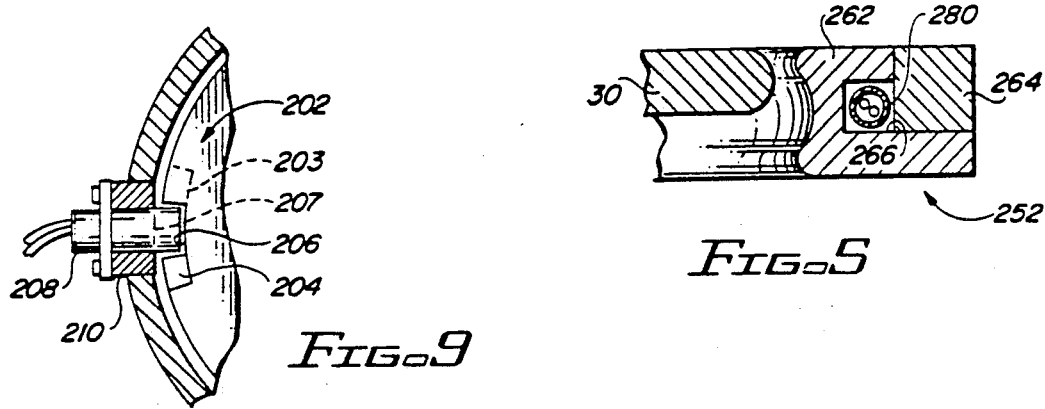
FIG. 9
FIG. 5

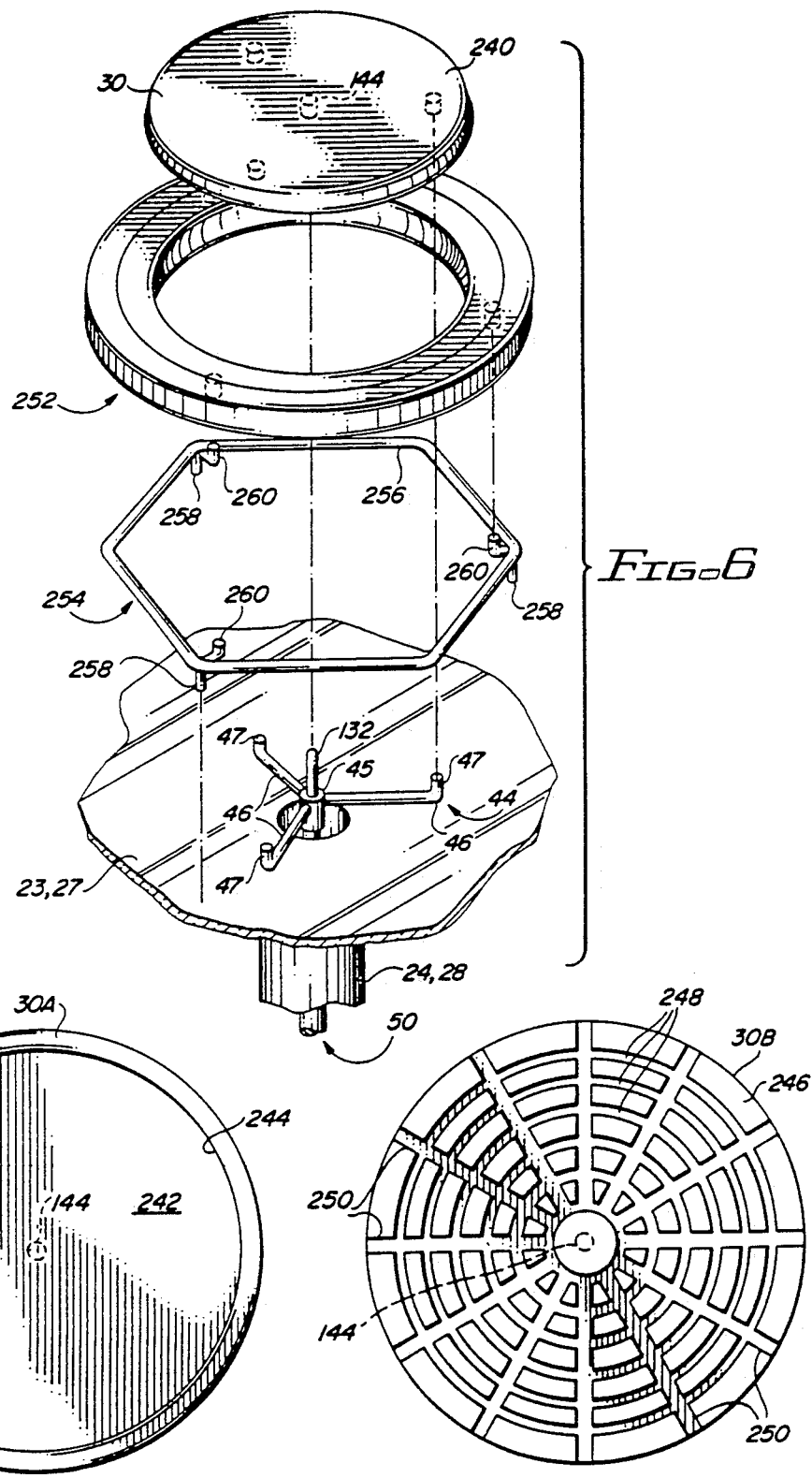

SUSCEPTOR WITH TEMPERATURE SENSING DEVICE

This is a continuation, of application, Ser. No. 032,474, filed Mar. 31, 1987 now U.S. Pat. No. 4,821,674.

BACKGROUND OF THE INVENTION

1. Field of the Invention

This invention relates in general to deposition equipment of the type used for chemical vapor deposition of materials on substrates, and more particularly to a rotatable substrate supporting mechanism with temperature sensing device for use in the deposition chambers of such equipment.

2. Discussion of the Related Art

In the electronics art, it has long been a practice to employ chemical vapor deposition equipment for depositing various materials, on substrates at high temperatures as part of the process of manufacturing semi-conductor devices. Basically, chemical vapor deposition equipment includes a reaction chamber which is heated to a desired reaction temperature and is configured for the controlled flow of the material carrier gas therethrough. A base, which is commonly referred to in the art as a "susceptor", is located in the reaction chamber for supporting the substrates upon which the material is to be deposited by the well known chemical deposition process.

Prior art susceptors are typically of two basic types with the first being a single planar surface for use in a horizontal attitude and the second being an upstanding barrel shaped multi-surface structure. In either case, these susceptors are contigured to support a multiplicity of relatively small substrates, i.e. in the neighborhood of 2 to 5 inches in diameter, for simultaneously depositing materials on the multiplicity of substrates. While simultaneous deposition of materials on a multiplicity of substrates is desirable from a manufacturing standpoint, it has some drawbacks from a quality standpoint.

The first problem associated with multi-substrate processing relates to the carrier gas which contains the atoms of the deposition materials. As the gas, which may be referred to as a reactant gas, flows over the surfaces of the substrate and the susceptor, deposition of the materials results in changes in the concentration of the deposition materials in the carrier gas. Consequently, as the reactant gas flows across or over the length of these relatively large susceptors, across each individual substrate and across a multiplicity of such substrates, different rates of growth of the deposited layer of material have been found. A second problem is that of temperature control which is critical at the elevated temperatures needed for proper deposition. It is difficult, if not impossible, to control the temperature within the critical tolerances at all the desired locations within the relatively large reaction chambers. This results in different deposition layer thicknesses from one substrate to another, and can even produce varying thickness within the individual substrates. Still another problem is contamination which can result from various factors such as the handling techniques used to load and unload the substrates, the introduction of the carrier gas into the reaction chamber, and indeed from the reaction chamber itself. The carrier gas not only deposits the deposition material on the substrate, but also deposition takes place on the walls of the reaction chamber. In the relatively large reaction chambers required for multi-substrate processing, the unwanted deposits on the walls of the reaction chambers can be inadvertently incorporated into the growing layers being deposited on the substrates.

These problems and drawbacks, as well as other factors, all contribute to significant problems as the semiconductor devices and the uses to which they are put become more sophisticated. As a result, many changes and improvements have been made in the equipment that is used to simultaneously process a multiplicity of substrates. For example, some equipment manufacturers are now using automated loading and off-loading devices to eliminate, or at least substantially reduce contamination resulting from human handling. Futher, the second type of susceptor discussed above, i.e. the upstanding barrel shaped structure, is being rotated in some instances about its vertical axis to rotate the multiplicity of substrates about that same axis within the reaction chamber. Such barrel rotation is being done for averaging purposes, that is, temperature averaging and reactant gas flow averaging. Obviously these and other things which are being done to improve the simultaneous multi-substrate processing techniques have the simultaneous multi-substrate processing techniques have helped. However, there are practical limits which many feel will ultimately make the simultaneous multi-substrate processing techniques unacceptable or at least undesirable. One of the limitations is that of the equipment being adaptable for handling larger diameter substrates. The economics of larger diameter substrates are causing many manufactures of semi-conductor devices to use larger substrates. However, increasing the size of the substrate is causing some problems with regard to temperature differentials across the substrate, decreasing concentrations of the deposition material as it is carried across the substrate, and the like.

Therefore, steps are being taken now by some equipment manufacturers to make suitable single substrate processing equipment which is significantly simpler in so far as controlling the various factors involved in chemical vapor deposition. Single substrate chemical vapor deposition equipment becomes inherently more desirable than multi-substrate equipment as the manufacturers of semi-conductor devices change to larger substrates, i.e. 6 to 8 inches in diameter or even larger. One important consideration is the cost at risk when processing one substrate as opposed to the simultaneous multi-substrate processing. That is, if something goes wrong, the monetary loss is far less with one substrate that it is with a plurality of substrates. The susceptors being used in single substrate processing equipment consist essentially of some sort of platform, or base, for supporting the substrate and contribute nothing further to the chemical vapor deposition equipment.

Therefore, a need exists for a new and improved susceptor for use in single substrate chemical vapor deposition equipment which enhances the process and thereby helps in eliminating, or at least reducing, the problems and shortcomings of the prior art.

SUMMARY OF THE INVENTION

In accordance with the present invention, a new and useful rotatable substrate supporting mechanism is disclosed for use in single substrate chemical vapor deposition equipment. The rotatable substrate supporting mechanism includes a circular susceptor, or platform, for receiving a single circular substrate and supporting the substrate in the reactant gas flow path through the reaction chamber. The susceptor is provided with an axially depending driveshaft which is suitably coupled to a variable speed drive means for rotation of the susceptor, and thus the substrate, about a vertical rotation axis. By rotating the substrate about this axis, which is normal with respect to the center of the substrate, an averaging of the deposited material growth rates results thus overcoming the problem in concentration depletion of the deposition materials as the reactant gas flows past the substrate. Rotation of the susceptor also produces an averaging of the temperature gradient which results in a significant reduction in the temperature differences both in the susceptor and in the substrate being supported thereon.

While the rotatability of the susceptor will inherently improve the temperature characteristics in comparison to a fixed non-rotatable susceptor, the substrate supporting mechanism of the present invention is preferably configured to provide a sophisticated temperature sensing system which can be used to produce accurate temperature control in the vicinity of the susceptor. The temperature sensing system includes a first temperature sensor means which in the preferred embodiment, extends axially and upwardly through the axial driveshaft of the susceptor for sensing the temperature at the center of the susceptor. A fixed concentric ring is located in close surrounding relationship with the rotatable susceptor and at least one, and preferably more, additional temperature sensing means are providing at circumferentially spaced increments in the fixed ring, and these additional temperature sensing means will sense the temperatures at various points about the rotatable susceptor. Each of the temperature sensing means produces a signal indicative of the sensed temperature, and those signals may be coupled to a suitable control system which operates in conjunction with the heating system of the reaction chamber for temperature control purposes.

Due to the rotation capability of the susceptor and the placement of the first temperature sensing means within the axial driveshaft of the susceptor, the driveshaft must be tubular and the susceptor must be provided with clearance relative to the reaction chamber. Therefore, the mechanism of the present invention is provided with a purging system by which a purge gas is introduced under elevated pressure into the tubular shaft which is configured so that the purging gas will emerge from the driveshaft below the susceptor. In this way, the purge gas will inhibit the flow of reactant gas into the area below the susceptor and into the tubular shaft and thereby prevent deposited material contamination in those areas. In addition, the purging gas will inhibit the formation of hot spots in the mechanism.

In addition to the above, the mechanism of the present invention is provided with means for vertical adjustment whereby the susceptor, and thus the substrate carried thereon, can be set at an optimum position in the reactant gas flow path of the reaction chamber. Also, the mechanism is provided with a drive control system by which the rotational speed of the susceptor may be adjusted to a desired speed and by which the susceptor's rotation is stopped at the same point each time for substrate handling purposes.

Accordingly, it is an object of the present invention to provide a new and improved substrate supporting mechanism for use in single substrate chemical vapor deposition equipment.

Another object of the present invention is to provide a new and improved substrate supporting mechanism having a susceptor, or platform, upon which a single substrate is supported in the reactant gas flow path in a heated reaction chamber with the susceptor being rotatable for rotating the substrate about an axis which is normal to the center of the substrate for temperature and growth rate averaging purposes.

Another object of the present invention is to provide a new and improve substrate supporting mechanism of the above described character which includes a temperature sensing means for sensing the temperature at various points in and about the rotatable susceptor and producing signals indicative of the sensed temperatures with the produced signals being usable for temperature control purposes which interacts with the equipment heating system to provide a flat temperature profile across the substrate.

Another object of the present invention is to provide a new and improved substrate supporting mechanism of the above described character which further includes a purging system by which a purge gas under elevated pressure is introduced into the mechanism to prevent the flow of the reactant gas into the mechanism itself and into the area below the rotatable susceptor.

Still another object of the present invention is to provide a new and improved substrate supporting mechanism of the above described type wherein the substrate supporting susceptor is adjustable along its rotational axis for optimum locating of the substrate in the reactant gas flow path through the reaction chamber.

Yet another object of the present invention is to provide the above described substrate supporting mechanism with a drive control system by which the rotating speed of the susceptor may be adjustably set to a desired rotation rate and by which the susceptor's rotation is stopped at the same location each time for improved substrate handling purposes.

The foregoing and other objects of the present invention as well as the invention itself, may be more fully understood from the following description when read in conjunction with the accompanying drawings.

BRIEF DESCRIPTION OF THE DRAWINGS

FIG. 4 is an enlarged top view of the substrate supporting susceptor and showing the concentric relationship of a fixed ring structure which is part of the temperature sensing system of the mechanism.

FIG. 5 is an enlarged fragmentary sectional view taken along the line 5—5 of FIG. 4.

FIG. 6 is an exploded perspective view showing the mounting structures and arrangement of the susceptor and the fixed ring of the temperature sensing system of the mechanism of the present invention.

FIG. 7 is a top view of a particular form of susceptor which is provided with an especially configured top surface upon which a substrate is supportable.

FIG. 8 is a view similar to FIG. 7 but which shows an alternate top surface configuration provided on the susceptor.

FIG. 9 is a fragmentary sectional view taken along the line 9—9 of FIG. 3.

DESCRIPTION OF THE PREFERRED EMBODIMENTS

In that chemical vapor deposition per se is well known in the art, only a brief description thereof will be presented herein for completeness of this disclosure and to ensure full understanding of the present invention. Briefly, a reactant gas, which contains gaseous forms of the atoms of the material to be deposited, is introduced into what is referred to as a reaction chamber in a manner which causes the reactant gas to flow through the reaction chamber in a path which is determined by reaction chamber configuration, gas injection location and the like. Reaction chambers are heated to relatively high temperatures, which are determined by the various factors of the particular process to be accomplished. By virtue of gas movement, temperature and chemical reaction, the material carried by the gas will be deposited and adhere to whatever is located in the gas flow path and will provide a deposition layer thereon. This general chemical vapor deposition technique is widely used in the electronics art for manufacturing semi-conductor devices.

Figure 1:
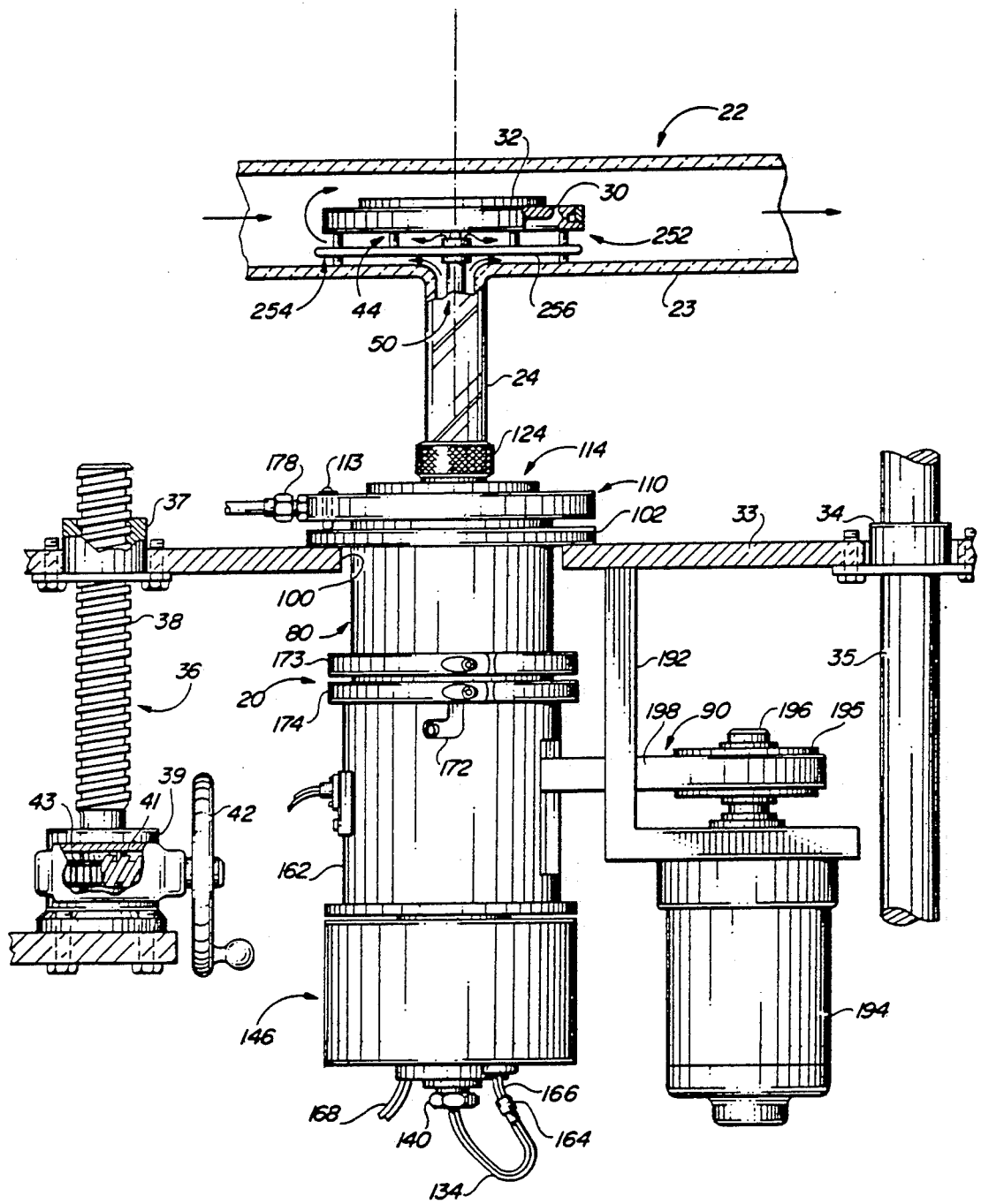
FIG. 1 is an elevational view of the substrate supporting mechanism of the present invention with the mechanism shown as being used in a type of reaction chamber which is commonly referred to as a horizontal flow reaction chamber.
Figure 2:
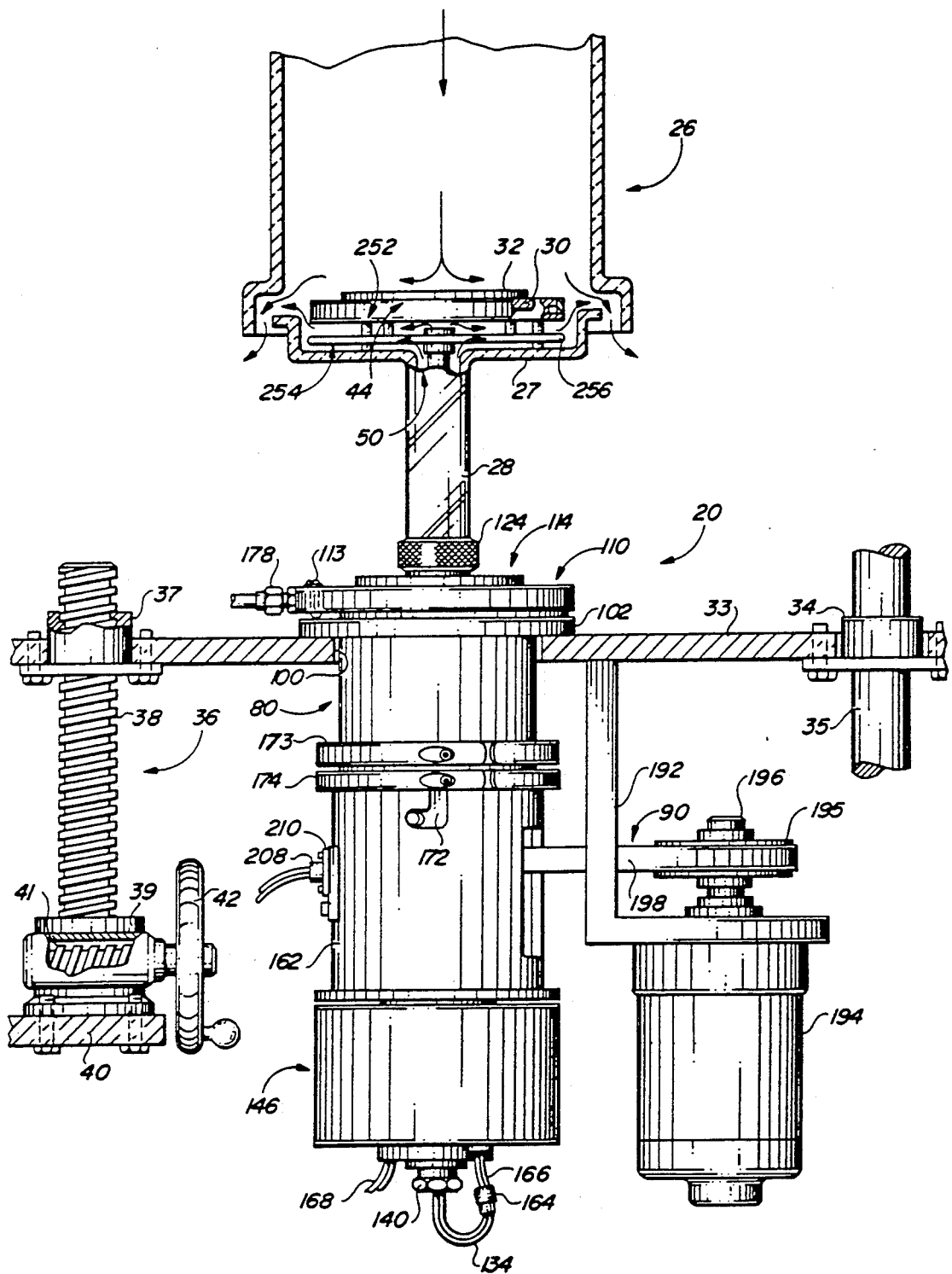
FIG. 2 is a view similar to FIG. 1 but showing the substrate supporting mechanism of the present invention as being used in a type of reaction chamber that is commonly referred to as an axial flow reaction chamber.

Referring more particularly to the drawings, FIGS. 1 and 2 show the rotatable substrate supporting mechanism of the present invention which is indicated in its entirely by the reference numeral 20. FIG. 1 shows the mechanism 20 as being used in conjunction with a reaction chamber 22 of the type sometimes referred to as a horizontal flow reaction chamber, and FIG. 2 shows the mechanism 20 as being used in conjunction with an axial flow reaction chamber 26. As is known, both horizontal flow and axial flow reaction chambers have been devised in various configurations and the particular chambers 22 and 26, which are only partially shown, are intended to be typical representations of such reaction chambers.

It will be noted however, that the reaction chamber 22 has a planar bottom surface 23 with a tubular shaft 24 depending integrally therefrom, and similarly, the reaction chamber 26 has a planar bottom surface 27 from which a tubular shaft 28 integrally depends. As will hereinafter be described in detail, the rotatable substrate supporting mechanism is coupled to the depending end of either of the tubular shafts 24 or 28 and portions of the mechanism 20 extend upwardly through the axial bores of the shafts into the interior of the reaction chamber 22 and/or 26, to provide, among other things, a platform, or susceptor 30 upon which a substrate 32 is demountably supportable. The substrate 32 is placed on the susceptor 30 prior to commencement of the chemical vapor deposition process and is off-loaded when the desired deposition film, or layer has been formed thereon and the process has been completed.

The rotatable substrate supporting mechanism 20 is carried in a manner which will be described in detail below, on a suitable support plate 33 which is disposed below the reaction chamber 22 and/or 26. The plate 33 is provided with a plurality of bushing mounts 34 (one shown) each of which is slideably movable along a different one of a plurality of fixed vertical rod 35 (one shown). The plate 33, and thus the entire mechanism 20, is vertically adjustable relative to the reaction chamber 22 and/or 26 by a vertical elevating means 36. The vertical elevating means 36 includes a worm gear nut 37 carried on the support plate 33 for movement along an elongated rotatable worm gear 38. The worm gear 38 is journaled for rotation about its longitudinal axis in a drive housing 39 that is fixedly carried on a suitable support means 40. The housing 39 contains a suitable gear train such as the illustrated worm gear 41 which is rotatable by means of the hand wheel 42, and the worm gear 41 is in driving meshed engagement with a spur gear 43 (FIG. 1) that is mounted on the lower end of the elongated worm gear 38. Thus, manual rotation of the hand wheel 42 in the appropriate direction will, by virtue of the gears 41 and 43, cause the worm gear 38 to be rotatably driven. Such driving of the worm gear 38 will cause the worm gear nut 37 to travel along the worm gear 38 and thereby raise or lower the support plate 33 as determined by the direction of rotation of the hand wheel 42.

The above described vertically adjustable elevating means 36 is a coarse adjustment for positioning the susceptor 30 at an optimum position within the reaction chamber 22 and/or 26 and a fine adjustment device is also provided as will hereinafter be described.

The susceptor 30 is of circular substantially planar configuration and is demountably carried and rotatably driven by a spider structure 44 having a central hub 45 from which at least three arms 46 extend radially. Each of the arms 46 is bent or otherwise formed at its distal end to provide an upstanding peg 47 upon which the susceptor 30 is supported. The hub 45 of the spider 44 is provided with a truncated conical bore 48 in which the tapered upper end 49 of a driveshaft assembly 50 is disposed.

The driveshaft assembly 50 is a multi-piece assembly including an elongated rotation shaft 51 at the uppermost end of the assembly. The rotation shaft 51, having the tapered upper end 49 as mentioned above, is provided with an axial bore 52 for reasons which will become apparent as this description progresses. The rotation shaft 51 has an enlarged tapered lower end 53 of inverted frusto-conical configuration with an enlarged diameter upwardly facing annular shoulder 54 in axially spaced relationship with the lower open end of the shaft.

As is customary in the art, the reaction chambers 22 and 26 are fabricated of a suitable transparent material, such as fused quartz, for the transmission of heating radiation from a suitable heat source (not shown). Since the depending tubular shafts 24 and 28 depend integrally from their respective reaction chambers 22 and 26, they too are formed of the same transparent material. For the same heat transmission reason, the above described spider structure 44 and the rotation shaft 51 are also formed of transparent material.

The driveshaft assembly 50 further includes a spindle 56 having an upper body portion 57 and a lower body portion 58 which may be formed as a single unitary structure or may be formed as two separate pieces for ease of fabrication and joined together such as by welding in the manner indicated in the drawing. In either case, the upper body portion 57 is of generally cylindrical configuration with a reduced diameter upper end 59 which forms an upwardly facing annular shoulder 60 on the upper body portion 57. The reduced diameter upper end 59 is provided with external threads as indicated at 61 and an axial bore 62 is formed through the upper body portion 57. The axial bore has a tapered socket 64 at its upper end in which the enlarged tapered lower end 53 of the rotation shaft 51 is seated. A suitable holddown nut 66 is threadingly carried on the upper end of the body portion 57 and a wave washer 68, or other suitable biasing means, is contained within the holddown nut 66 to wedgingly hold the tapered lower end 53 of the rotation shaft 51 in the socket 64 of the spindle body portion 57. The hold-down nut 66 is provided with a suitable aperture through which the rotation shaft extends.

For reasons which will hereinafter be described in detail, the upper body portion 57 of the spindle 56 is further provided with a depending externally threaded boss 70 and a plurality (two shown) of passages 72 which extend downwardly from the annular shoulder 60 into intersecting relationship with the axial bore 62 at a location spaced below the tapered socket 64 portion of the axial bore.

The lower body portion 58 of the spindle 56 is of elongated cylindrical configuration and defines an axial bore 74 which has an inside diameter that is considerably larger than the axial bore 62 formed through the spindle's upper body portion 57 and is larger than the outside diameter of the depending boss 70 thereof for reasons which will be explained below. The lower body portion 58 is provided with a reduced diameter lower end 76 and has external threads 77 formed thereon immediately above the point which the diameter of the lower body portion 58 is reduced.

A bearing means, in the preferred form of rotary seal 80, is provided with a non-rotating portion 81, which is mounted in a manner which will hereinafter be described, and has an elongated rotatable sleeve 82 journaled for rotation therein, with the sleeve being axially disposed in the bearing means with a dependingly extending lower end 83 having external threads 84 on the lowermost part of depending end 83. The driveshaft assembly 50 is disposed so as to extend coaxially through the rotatable sleeve 82 in a manner whereby the sleeve 82 and the driveshaft assembly 50 rotate as a single entity.

Thus, the bearing means 80 is employed in the substrate supporting mechanism 20 to support and rotatably journal the driveshaft assembly and to prevent gas leakage for reasons which will become apparent as this description progresses. The bearing means in the form described is commercially available from the Ferrofluidics Corporation of 40 Simon Street, Nashua, N. H. 03061 and is identified as Model Number HS-1500-F-W.

A driven pulley 86 is attached, such as by means of the set screw shown, to the dependingly extending lower end 83 of the sleeve 82 and a position indicator wheel 88 is threadingly mounted immediately below the pulley on the threads 84 provided on the lowermost end of the sleeve 82. Both the driven pulley 86 and the position indicator wheel 88 form a part of a drive means 90 which will hereinafter be described in detail.

A special cage nut 92 having an internally threaded upper portion 93 which is threadingly carried on the threads 84 of the sleeve 82 and an internally threaded lower portion 94 which is threadingly carried on the threads 77 of the spindle 56. The upper and lower portions 93 and 94 of the cage nut 92 are interconnected in axially spaced relationship by at least two diametrically opposed ribs 95 (one shown) which provided openings for access to an adjustment nut 96 which is captively retained between the upper and lower portions 93 and 94 of the cage nut 92. As shown, the adjustment nut 96 is threadingly mounted on the threaded end 77 of the spindle 56. Manual rotation of the adjustment nut 96 will axially slideably move the entire driveshaft assembly 50 relative to the sleeve 82 of the rotary seal bearing means 80, and this is used to make the above mentioned fine vertical adjustments of the susceptor 30 in the reaction chamber 22 and/or 26.

The substrate supporting mechanism 20 is carried on the above mentioned support plate 33 which has an opening 100 formed therethrough. An adjustment plate 102 is mounted atop the support plate 33 and is provided with an opening 104 which is substantially coaxial with respect to the opening 100 of the support plate. The adjustment plate 102 is connected to the support plate 33 by a suitable bolt 105 about which the plate 102 is pivotably movable for adjustable location in a horizontal plane of the opening 104. The adjustment plate 102 is lockable in the desired position by a diametrically opposed bolt 106 and washer 107 with the bolt 106 passing downwardly through an enlarged aperture 108 of the plate 102 into threaded attachment with the support plate 33. A bearing mounting plate 110 having an opening 111 formed therethrough is positioned atop the adjustment plate 102 and is configured to provide an axially depending reduced diameter boss 112 which extends approximately half way down into the opening 104 of the adjustment plate 102. The non-rotating portion 81 of the bearing means 80 is bolted fast to the lower surface of the boss 112 so that it extends approximately half way up into the opening 104 of the adjustment plate 102. The bearing mounting plate 102 is mounted in place by the bolt 105 and others (not shown) which, as previously discussed, are used to fix the adjustment plate 102 on the support plate 33. In addition to supporting the bearing means, the bearing mounting plate 110 is adjustably tiltable by means of the adjustment screw 113 which depends from the seal mounting plate 110 into bearing engagement with the upper surface of the adjustment plate 102. From the above, it will be seen that the adjustment plate 102 and the bearing mounting plate 110 are independently adjustable and cooperatively interact to provide the properly aligned coaxial and vertical relationships of the bearing 80 and the driveshaft assembly 50.

A coupling plate 114 is positioned atop the bearing mounting plate 110 and is free to float into aligning relationship with the bearing mounting plate 110 and the depending tubular shaft 24 and/or 28 of the reaction chambers 22 and 26 respectively. Once the aligned relationship has been established, such as during initial assembly of the substrate supporting mechanism 20, the coupling plate 114 may be tightened down against any further additional movement such as by means of the illustrated bolt 116, and others (not shown). The coupling plate 114 is formed with an axially upwardly extending externally threaded boss 118, and an axial bore 120 is formed through the coupling plate. An O-ring seal 122 is provided at the upper end of the boss 118 so as to be in sealed circumscribing engagement with the peripheral surface of the depending tubular shaft 24 or 28. A clamping nut 124 having an axially opening 125 formed therethrough is threadingly carried on the boss 118 to exert a circumferentially compressive force on the O-ring seal 122 by virtue of a compressing ring 126 carried in the clamping nut.

A heat sensing means in the preferred form of a thermocouple 130 is mounted in the upper end of a sheath 132 formed of suitable heat resistant material. The sheath 132 is of elongated configuration and is open on the end 133 thereof which is opposite to the closed end in which the thermocouple 130 is contained, with the open end being provided for exiting of the thermocouple wires 134 from the sheath. The lower end portion of the sheath 132 is axially disposed in a tube 136 having a fitting means 138 on its upper end and having a nut 140 on its lower end. The tube 136 and its associated fitting 138 and nut 140, is used to install and hold the sheath 132 in the axial bore that is cooperatively formed by the bores of the various components which make up the driveshaft assembly 50. As shown, the fitting means 138 is threadingly attached to the depending boss 70 of the upper body portion 57 of the spindle 56, and a suitable O-ring seal 142 is provided at the junction of the fitting means 138 and the boss 70 to prevent gas leakage downwardly through the tube 136 as will hereinafter be described. The lower end, that is, the nut 140 extends below the open bottom end of the spindle 56 and is used simply as a tool for attaching the upper end fitting of the tube to the boss 70.

As shown, the upper closed end of the sheath 132 extends from the bore 52 of the rotation shaft 51 upwardly into a blind central cavity 144 formed in the lower surface of the susceptor 30. In this way, the thermocouple 130 will sense the temperature at the center of the susceptor 30 and produce an electric signal indicative of the sensed temperature in the manner well known in the art. The thermocouple 130 forms part of a temperature sensing system of the substrate supporting mechanism 20 as will hereinafter be described in detail.

In that the sheath 132 is axially carried in the driveshaft assembly 50 as described above, it will rotate along with the driveshaft assembly. For this reason, a slip-ring means 146 is provided on the lower end of the substrate supporting mechanism 20. The slip-ring means 146 is commercially available from the IEC Corporation, 3100 Longhorn Boulevard, Austin Tex. 78759, and is a sealed unit identified as Model No. IECFCS. The slip-ring means 146 has an axial sleeve 148 therein which is coupled by means of a clamping nut 150 to the reduced diameter lower end 76 of the spindle 52 for rotation therewith. The lower reduced diameter end 76 of the spindle 56 extends axially through the sleeve 148 of the slip-ring means 146, and the lower end of the sleeve 148 is coupled, such as by a pin 152 to the rotatable outer portion 154 of the slip-ring means. The slip-ring means 146 has a fixed core 156 which is coaxially disposed between the inner sleeve 148 and the rotatable portion 154. The core 156 is fixed against rotation by means of a flange 158 that is suitably attached to the upper end of the core 156 and is also attached by bolts 160 to the lower end of a housing 162.

The thermocouple wires 134 which extend from the sheath are connected by means of a suitable plug 164 to the wires 166 which extend from the rotatable outer portion 154 of the slip-ring means 146. The electric signal produced by the thermocouple 130 is thereby transmitted via the wires 134 and 166 to the rotatable portion of the slip-ring means 146, and by the well known slip-ring method, are conducted to the fixed core 156 thereof. The signal received in the fixed core 156 is coupled by suitable wires 168 extending from the core 156 to a point of use (not shown).

The housing 162 is of cylindrical open ended configuration defining a bore 170 with a counterbore 171. The housing 162 is suspendingly carried by the rotary bearing means 80 such as by means of the bayonette mounting arrangement 172 shown in FIGS. 1 and 2, and the split clamps 173 and 174 shown best in those same figures.

In that the reaction chambers 22 and/or 26 are provided with the depending tubular shafts 24 and 28 and the driveshaft assembly 51 is tubular, the rotatable substrate supporting mechanism 20 is provided with a purging system by which the reactant gas, and deposition material carried thereby, through the reaction chamber, will be prevented from flowing into the area below the susceptor 30 and downwardly into the mechanism 20.

Figure 3:
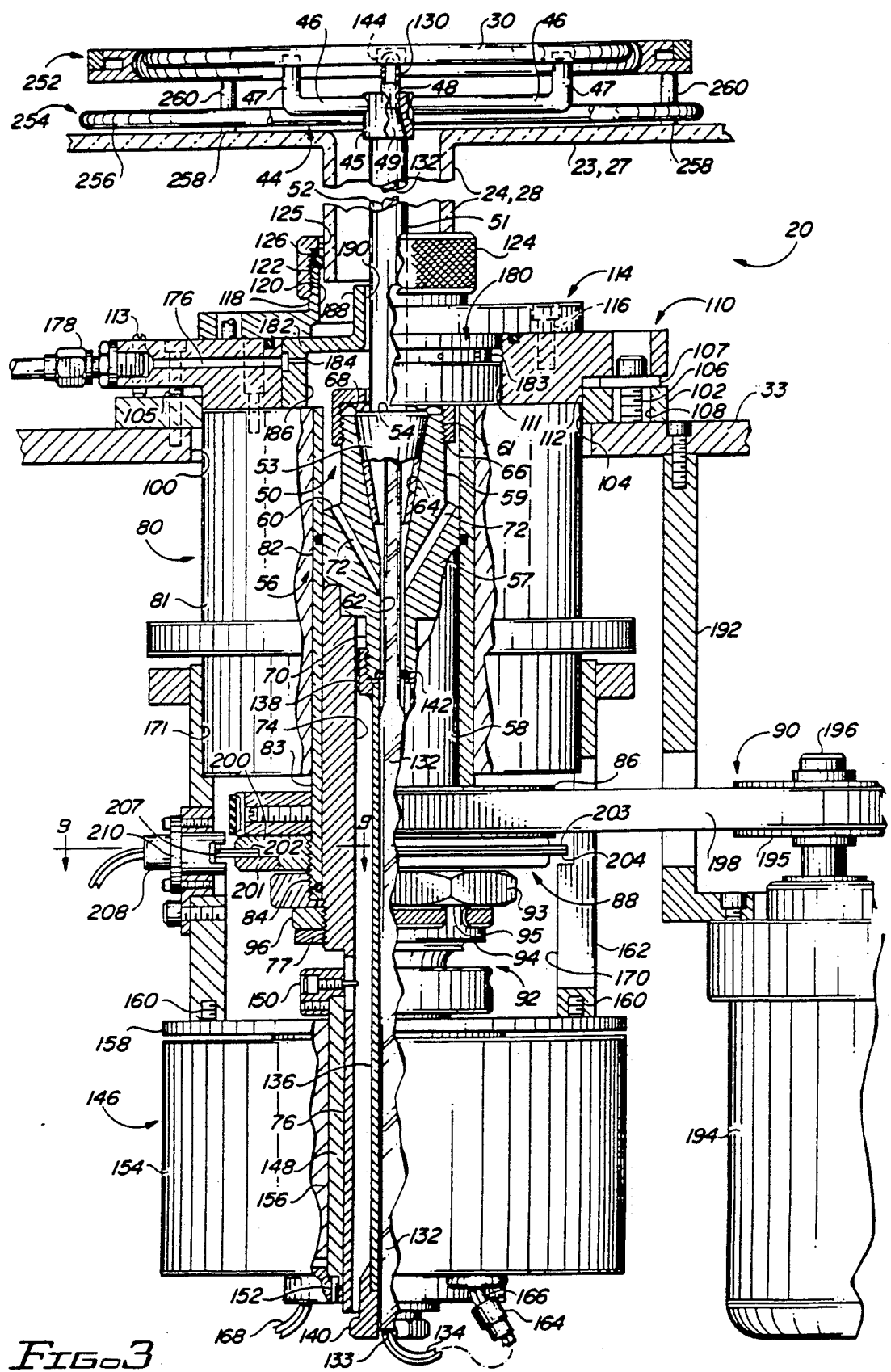
FIG. 3 is an enlarged elevational view which is partially broken away to show the various features of the substrate supporting mechanism.

As shown in FIG. 3, the bearing mounting plate 110 is provided with a passage 176 one end of which opens into the bore 111 thereof, with the other end being provided with means 178, such as the fitting shown, for directing a suitable purge gas under elevated pressure from an external source (not shown) into the bore 111 of the bearing mounting plate. A gas restrictor housing 180 is mounted in the bore 111 of the bearing mounting plate 110 and is configured to have an inverted cup-shaped body 182. The body 182 is provided with an annular groove 183 which aligns with the inwardly opening end of the passage 176 for receiving the purge gas therefrom. A plurality of incrementally spaced injection ports 184 extend from the annular groove 183 radially into the cavity 186 defined by the cup-shaped body 182. In that the body 182 opens downwardly, the purge gas received in the cavity 186 will flow downwardly into the annular recess between the reduced diameter upper end 59 of the spindle 56 and the upper end of the sleeve 82 of the rotary bearing means 80. The gas received in that annular recess will flow through the passages 72 of the spindle 56 into the bore 62 of the spindle. By virtue of the O-ring seal 142 which sealingly separates the lower end of the bore of the driveshaft assembly 51 from the upper end thereof, the purge gas received from the passages 72 will flow upwardly in the bore 62 of the spindle 56 into the bore 52 of the rotation shaft 51. In that the top end of the rotation shaft 51 is open so that the thermocouple sheath 132 can extend therefrom to the susceptor 30, upwardly flowing purge gas will exit the rotation shaft 51 under the central portion of the susceptor 30.

The gas restrictor housing 180 further includes a boss 188 which extends axially upwardly from the cup-shaped body 182 and defines a bore 190 through which the rotation shaft 51 axially extends. The outside diameter of the rotation shaft 51 is smaller than the inside diameter of the bore 190 to provide an annular gap therebetween. Therefore, some of the purge gas received in the cavity 186 will flow upwardly through that annular gap into the bore of the tubular shaft 24 or 28 of the reaction chambers 22 or 26, and that gas will flow upwardly into the area below the susceptor 30.

A suitable bracket means 192 is mounted so as to depend from the support plate 33 and a variable speed DC motor 194 is carried by the bracket. A drive pulley 195 is mounted on the output shaft 196 of the motor, and a belt 198 is employed to transmit rotary power from the DC motor 194 to the driven pulley 86 carried on the driveshaft assembly 50 of the substrate supporting mechanism 20.

As indicated in phantom lines in FIG. 4, most, if not all, substrates are provided with a notch 199 for orientation purposes. For this reason, it is desirable that the susceptor 30 be stopped at the same point in its rotation each time that it is stopped for placement and removal of a substrate. Therefore, the position indicator wheel 88, which was hereinbefore mentioned as being part of the drive means 90, is provided with a circular base 200 to which a nut 201 is demountably attached, such as by means of the illustrated threaded engagement, to hold an index means 202 therebetween. The index means 202 preferably includes a pair of ring-shaped plates 203 and 204 which are in contiguous coaxial engagement with each other. As shown in FIG. 9, the upper plate 203 has a notch formed in its peripheral edge and the lower plate 204 has a similar notch. The two plates 203 and 204 may be adjustably rotated relative to each other so that the notches thereof cooperatively form a slot 206 which is adjustably variable as to its length. This adjustment feature of the index means 202 is desirable to provide the rotatable susceptor mechanism 20 with the capability of being repeatedly stopped at the same place, i.e. home position, regardless of the rotational home speed at which the mechanism is to be driven. However an index means having a fixed size slot (not shown) may be used whenever a single rotational home speed is to be used, as will hereinafter be described.

The index means 202 is disposed so that the variably sized slot 206 thereof is rotatably driven through a groove 207 formed in the bifurcated end of a sensor switch 208. The sensor switch 208 is carried in a suitable mounting bracket 210 which is bolted or otherwise attached to the housing 162 so that the bifurcated end of the switch 208 extends radially into the interior of the housing 162 and straddles the rotational path of the index means 202 of the position indicator wheel 88.

Figure 13:
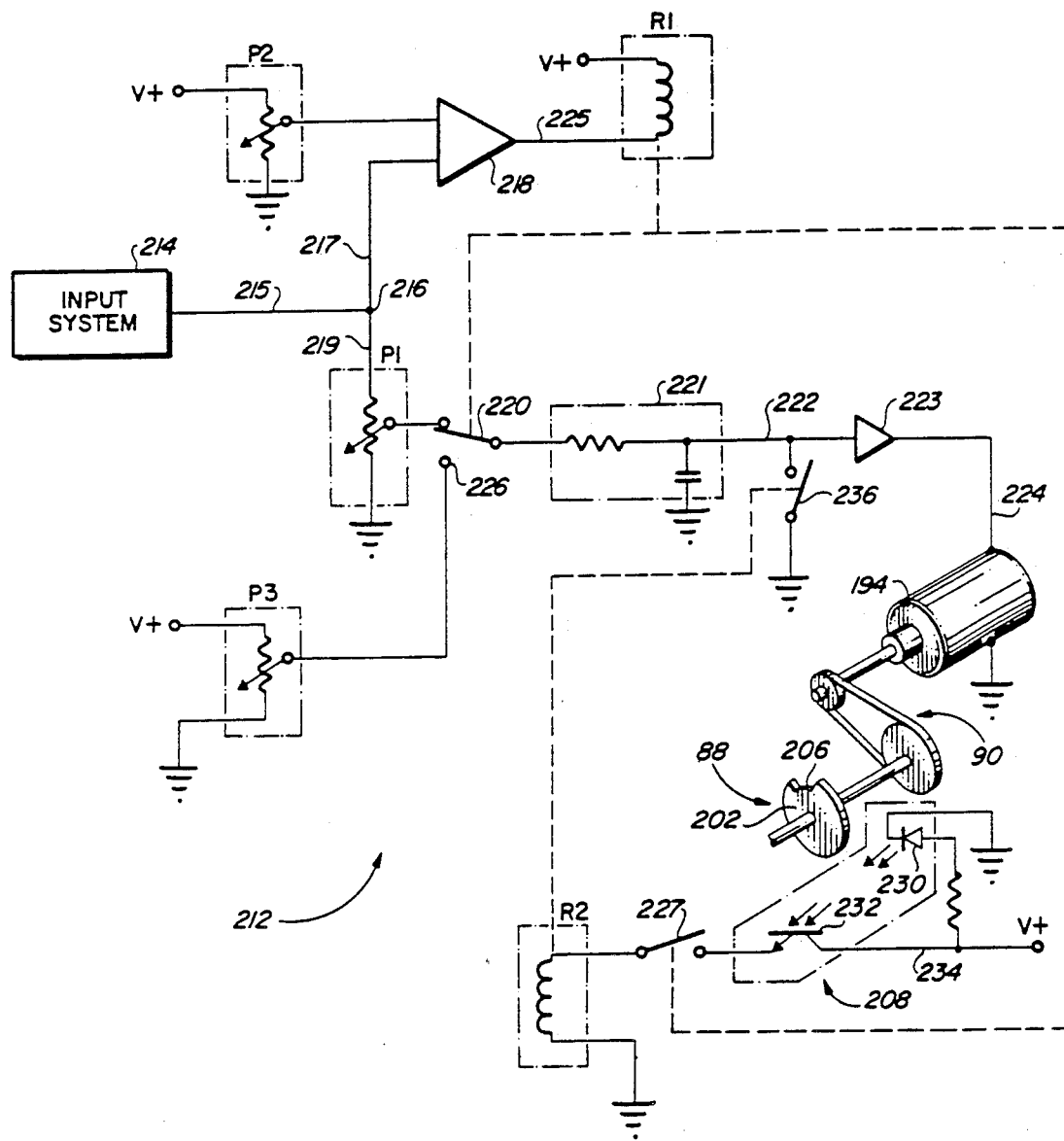
FIG. 13 is a schematic drawing of the drive control system of the substrate supporting mechanism of the present invention.

Reference is now made to the schematic wiring diagram of FIG. 13 which shows the various components which cooperatively form a control system 212 for driving the rotatable substrate supporting mechanism 20. First of all, a suitable programmable input system 214, which is not part of the control system 212, except for its supplying of an input signal having a predetermined time duration, is used to adjustably determine, among other things, the length of time of a mechanism cycle. The input system 214 applies an input signal, i.e. a voltage, via a conductor 215 to a junction point 216 so that the voltage is simultaneously applied by a conductor 217 to the first terminal of voltage comparator 218 and by a conductor 219 to a potentiometer P1. The potentiometer P1 is adjustably set for determining the normal rotational speed of the mechanism 20, in otherwords, the input system 214 cannot drive the mechanism 20 at speeds above that set by the potentiometer P1. The output voltage from the potentiometer P1 provides a first control signal which is directed through a two position contactor 220 of a relay R1 and through a resistive-capacitive network 221 (RC) by a conductor 222 which applies that voltage to a suitable amplifier 223. The amplified voltage is directed by a conductor 224 to the variable speed DC motor 194 for driving the driveshaft means at a relatively high speed.

A second potentiometer P2 is used to apply an adjustably variable voltage to the second input terminal of the above mentioned voltage comparator 218. The comparator 218 is non-conductive when the voltage value from the input system 214 is above the voltage value applied by the potentiometer P2. In otherwords, when the voltage from the input system 214 is at a relatively high value, for producing normal rotational speed of the motor 194, the comparator 218 will be non-conductive. However, when the voltage from the input system 214 begins to decrease in value, indicative of an end of a cycle of the mechanism 20, the comparator 218 will be enabled when the voltage from the input system 214 drops in value below that applied by the potentiometer P2. When the comparator 218 is enabled, a voltage at its output terminal will be coupled by conductor 225 to the relay R1, for energizing thereof. When the relay R1 is energized in this manner, it will move the two position contactor 220 out of its normal position into contact with the terminal 226, and simultaneously close the normally open contactor 227 thereof. When the two-position contactor 220 is moved into contact with the terminal 226, the output voltage from a third potentiometer P3 provides a second control signal which is coupled through the RC network 221, the amplifier 223 to the D.C. motor 194. The potentiometer P3 is adjustably set to a voltage value which is less than that of the output value of the potentiometer P1 for rotatably driving the mechanism 20 at a reduced, or "home" speed.

The above mentioned sensor switch 208 is an optical device including a photoemitter diode 230 and a normally open photoreceptor transistor 232 on opposite sides of the index means 202 of the position indicator wheel 88. When the slot 206 of the index means 202 is rotated into position between the photoemitter diode 230 and the photoreceptor transistor 232, impinging light will render the photo transistor 232 conductive. When enabled in this way, the supply voltage applied to the input terminal of the photo transistor 232 by conductor 234, will pass through the contactor 227, which was closed upon energization of the relay R1, and will energize another relay R2. When the relay R1 is energized it will close its contactor 236 which completes a grounding circuit at the input of the amplifier 223 to drop the voltage at the input to zero thus stopping the motor 194.

The RC network 221 of the control system 212 is a time constant circuit which is used to control start-up and slow-down speeds of the rotational drive of the mechanism. In otherwords, the start-up and slow-down speeds must not be too abrupt or the substrate carried on the susceptor could be dislodged. Thus, the RC network produces in a well known manner, relatively smooth build-up or ramp, in the applied voltages to the motor 194, and a relatively smooth decrease or ramp, in those voltages when they are being removed from the motor 194.

While the control system 212 is preferably provided with the potentiometers P1, P2 and P3 for adjustable versatility of the mechanism 20, it will be understood than in most applications, fixed value voltage dropping resistors (not shown) could be used.

As indicated in FIG. 6, the susceptor 30 may be provided with a smooth planar upper surface 240 upon which a substrate to be processed is supportable. However, due to rotation of the susceptor and the flow of gas through the reaction chamber 22 and/or 26, it is preferred that the susceptor be formed with a non-smooth upper planar surface for positional stability of the substrate. In a first modified susceptor 30A shown in FIG. 7, a circular central recessed area 242 is provided for receiving a substrate and retaining it in the desired position within a circular rim 244. In a second modified susceptor 30B shown in FIG. 8, the upper surface 246 has a plurality of concentric grooves 248 of varying diameters, and a plurality of radially extending channels 250 formed therein. The grooves 248 and channel 250 cooperatively interact to allow the free flow of gasses between the substrate and the susceptor during placement and removal of the substrate to prevent undesired slipping movement of the substrate.

As hereinbefore mentioned, the substrate supporting mechanism 20 includes a temperature sensing system with the hereinbefore described heat sensing means 130 forming a part thereof. The temperature sensing system further includes a fixed ring structure 252 which is supported in substantially surrounding concentric relationship relative to the susceptor 30. The ring structure 252 is supported in upwardly spaced relationship with respect to the bottom surface 23 or 27 of the reaction chambers 22 or 26 by a stand 254 which is preferably formed of transparent material. The stand 254 as best seen in FIG. 6, has a multi-sided substantially ring-shaped rail 256 having depending feet 258 for resting on the bottom surface of the reaction chamber and upstanding pins 260 for supporting the ring structure 252 in a fixed non-rotating position. Although the stand 254 is shown as being of a fixed height relative to the bottom surface of the reaction chamber(s), that height may be change such at the time of manufacture, by employing feet and/or pins of different lengths.

As shown in FIGS. 4 and 5, the fixed ring structure 252 includes an inner ring body 262 and an outer ring body 264 which cooperatively define an annular passage 266 about the ring structure. In the illustrated embodiment, three temperature sensing means 268, 270, and 272 are shown as being disposed at various locations in the annular passage 266 of the ring structure 252. It will be understood that as few as one temperature sensing means can be employed or a multiplicity can be used as necessary to achieve the desired temperature sensing capability. It has been found that in horizontal flow reaction chambers, such as the one indicated at 22 in FIG. 1, the three temperature sensing means 268, 270, and 272 provide ideal temperature sensing capabilities when used in conjunction with the previously described temperature sensing means 130. As indicated by the arrow 274 in FIG. 4, the gas carrying the desired deposition materials, will flow across the ring structure 252 in a direction from what may be considered as the leading edge 276 to the trailing edge 278. The temperature sensing means 268 is located at the leading edge 276 to sense the temperature at that point. The temperature sensor means 130 will, as hereinbefore described, sense the temperatures at the center of the rotatable susceptor 20, and the other two temperature sensor means 270 and 272 will sense the temperature proximate the trailing edge 278 of the ring structure 252. The temperature sensing means 268, 270, and 272 are preferably of the same configuration as the previously described temperature sensor means 130. That is, the temperature sensor means are in the preferred form of thermocouples each of which is mounted in a sheath 280 of transparent material. The sheaths 280 of each of the thermocouples 268, 270, and 272 are of elongated configuration and extend from the ring structure 252 via suitable apertures 282, 283, and 284 formed through the outer ring body 264. In this way, the conductive wires 286, 288, and 290 of the thermocouples 268, 270, and 272 respectively, extend out of the hostile environment of the susceptor 20 and ring structure 252. The electric signals produced by the thermocouples 120, 268, 270, and 272 are coupled to a suitable temperature control device (not shown) which forms no part of the substrate supporting mechanism 20 of this invention.

Figure 10:
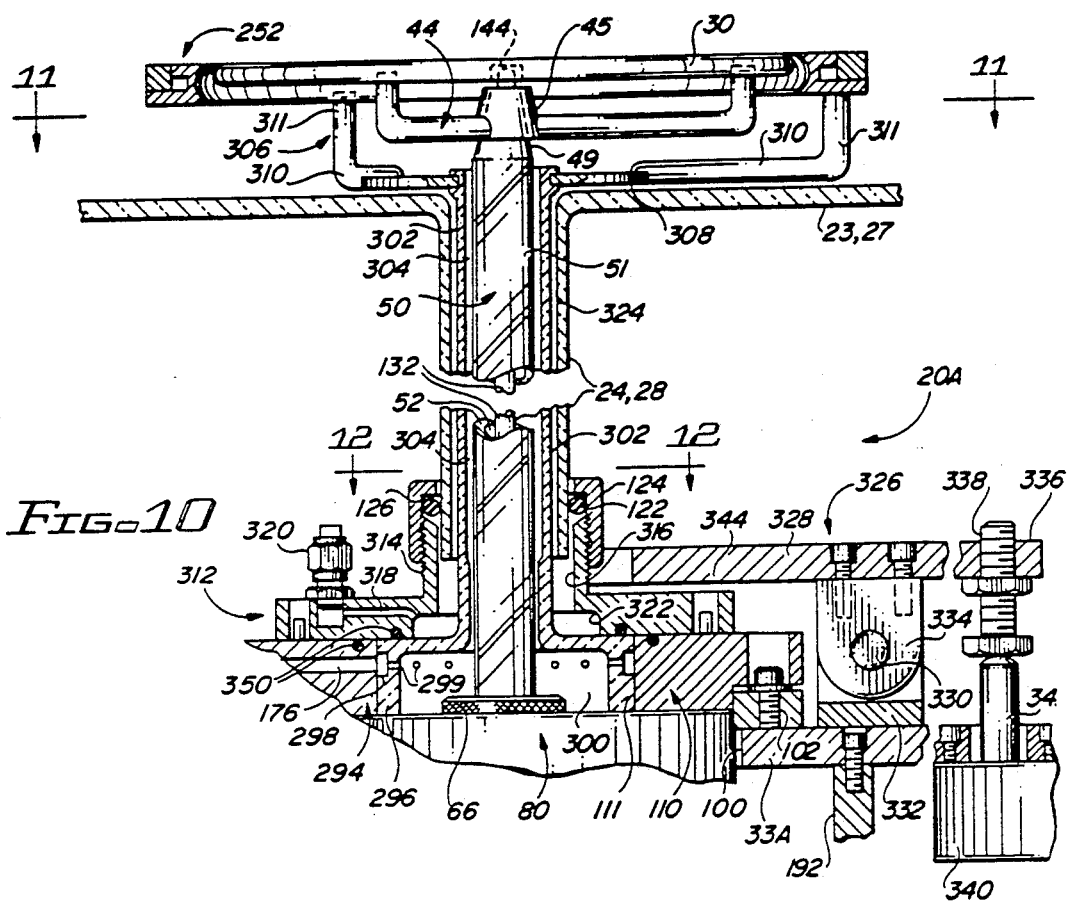
FIG. 10 is a fragmentary view similar to FIG. 3 and showing a modification of the substrate supporting mechanism of the present invention.
Figure 11:
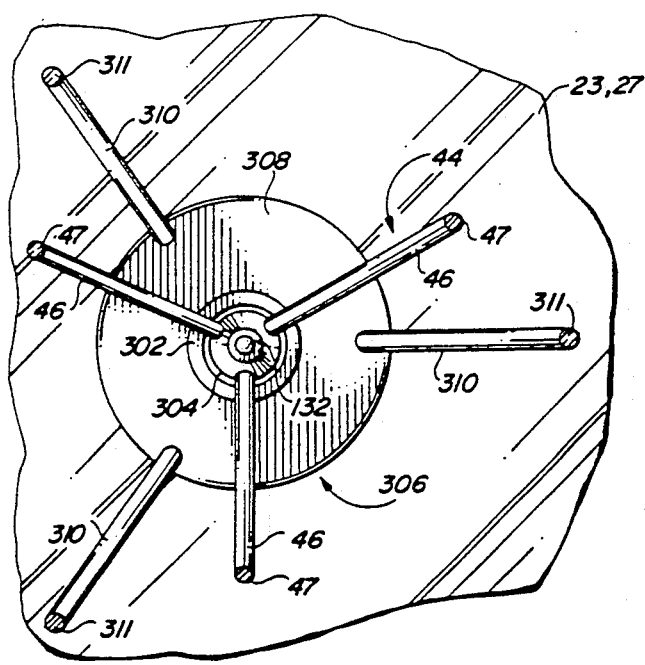
FIG. 11 is a fragmentary sectional view taken along the line 11—11 of FIG. 10.
Figure 12:
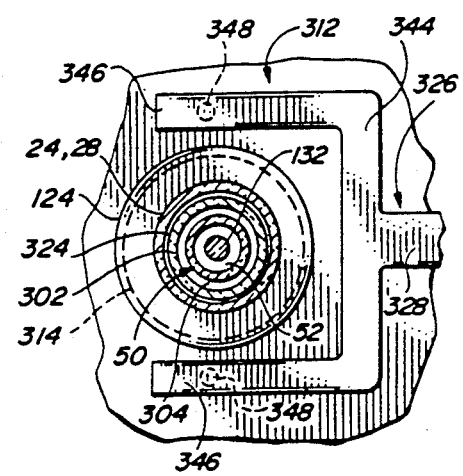
FIG. 12 is a fragmentary sectional view taken along the line 12—12 of FIG. 10.

Reference is now made to FIGS. 10, 11 and 12 wherein a modified form of the rotatable substrate supporting mechanism is shown and is indicated generally by the reference numeral 20A. The mechanism 20A is essentially the same as the previously described mechanism and has a modified form of gas restrictor housing 294 mounted in the bore 111 of the bearing seal mounting plate 110. The gas restrictor housing 294 has an inverted cup-shaped body 296 with the annular groove 298 and injection ports 299 for receiving the purge gas from the passage 176 of the seal mounting plate 110. The purge gas is directed into the downwardly opening cavity 300 of the gas restrictor housing 294, for movement downwardly and then upwardly into the bore 52 of the rotation shaft 51 in the manner hereinbefore fully described with reference to the mechanism 20. The modified gas restrictor housing 294 of the mechanism 20A has an elongated tube 302 extending axially upwardly therefrom. The rotation shaft 51 extends axially through the tube 302 which is sized to provide an annular gap 304 between the outside diameter of the rotation shaft 51 and the inside diameter of the tube 302 of the gas restrictor housing 294. Therefore some of the purge gas received in the cavity 300 of the gas restrictor housing 294 will flow upwardly through the annular gap 304 and emerge from the tube 302 below the susceptor 30.

The uppermost end of the tube 302 of the gas restrictor housing 294 is suitably configured to carry a stand means 306 preferably of transparent material upon which the ring structure 252 is supported. The stand means 306 includes a disc shaped body 308 having at least three arms 310 extending therefrom. Each of the arms 310 is provided with an upstanding pin 311 upon which the fixed ring structure 252 is carried.

By mounting the ring structure 252 on the stand means 306, rather than the stand 254 of the mechanism 20, the stand means 306, and thereby the ring structure 252 and the temperature sensing means 268, 270, and 272 (FIG. 4) carried thereby, are vertically adjustable along with the susceptor 30 as hereinbefore described with reference to the mechanism 20.

The modified form of substrate supporting mechanism 20A further includes a modified coupling plate 312 which, as in the case of the previously described coupling plate 114, is free to float into aligning relationship with the bearing mounting plate 110 and the depending tubular shaft 24 and/or 28 of the reaction chamber 22 or 26. The coupling plate 312 is provided with an axially upwardly extending externally threaded boss 314 defining an axial bore 316. The clamping nut 124, is threadingly carried on the boss 314 for exerting a circumferentially compressive force on the O-ring seal 122 by virtue of the compression ring 126 carried in the clamping nut 124. Purge gas, from an external source is supplied to a passage 318 formed in the coupling plate 312 such as through a suitable fitting means 320 so that the purge gas is directed into the counterbored lower end 322 of the coupling plate 312 and will flow upwardly in the annular space 324 between the depending tubular shaft 24 or 28 of the reaction chamber 22 or 26, and the elongated tube 302 of the gas restrictor housing 294.

Therefore, in the modified substrate supporting mechanism 20A the purging gas will flow upwardly through the rotation shaft 51, through the annular gap 304 between the rotation shaft 51 and the upstanding tube 302 of the gas restrictor housing 294, and through the annular space 324 discussed above.

The free floating coupling plate 114 of the first embodiment of the present invention was described as being bolted in a fixed position subsequent to its having been positioned in the desired aligned position. In many reaction chamber installations, such bolting in place may not be able to be accomplished due to the inability to reach the necessary points for accomplishing such bolting. Therefore, the modified mechanism 20A is shown as including an automatic clamping device 326.

The clamping device 326 includes a lever 328 which is pivotably carried on a suitable pin 330. The pivot pin 330 is mounted in clevis 332 which is mounted atop the support plate 33A, and a depending lug 334 is mounted on the lever 328 with the pivot pin 330 passing through a suitable aperture provided in the lug. One end 336 of the lever 328 extends away from the mechanism 20A and a suitable adjustment screw assembly 338 is carried in that end 336 of the lever. An electrically, pneumatically, or otherwise operated actuator mechanism 340 is mounted in the support plate 33A, and is operable for extending and retracting movement of an actuator pin 342. When actuated, such as at the beginning of an operational cycle, or cycles, of the mechanism 20A, the actuator pin 342 will move to its illustrated extended position and produce a counterclockwise pivot movement of the lever 328, as viewed in FIG. 10.

The other end 344 of the lever 328 is bifurcated to provide a pair of spaced apart arms 346 which are stradlingly disposed on diametrically opposed sides of the upwardly extending boss 314 of the coupling plate 312. Each of the arms 346 is provided with a depending pin 348 which will bear down on the coupling plate 312 when the lever 328 is pivotably moved in the manner hereinbefore described. When the clamping force is applied to the coupling plate 312 a compressive force will be applied to the O-ring seals 350 to prevent gas leakage between the coupling plate 312 and the bearing mounting plate 110.

Figure 14:
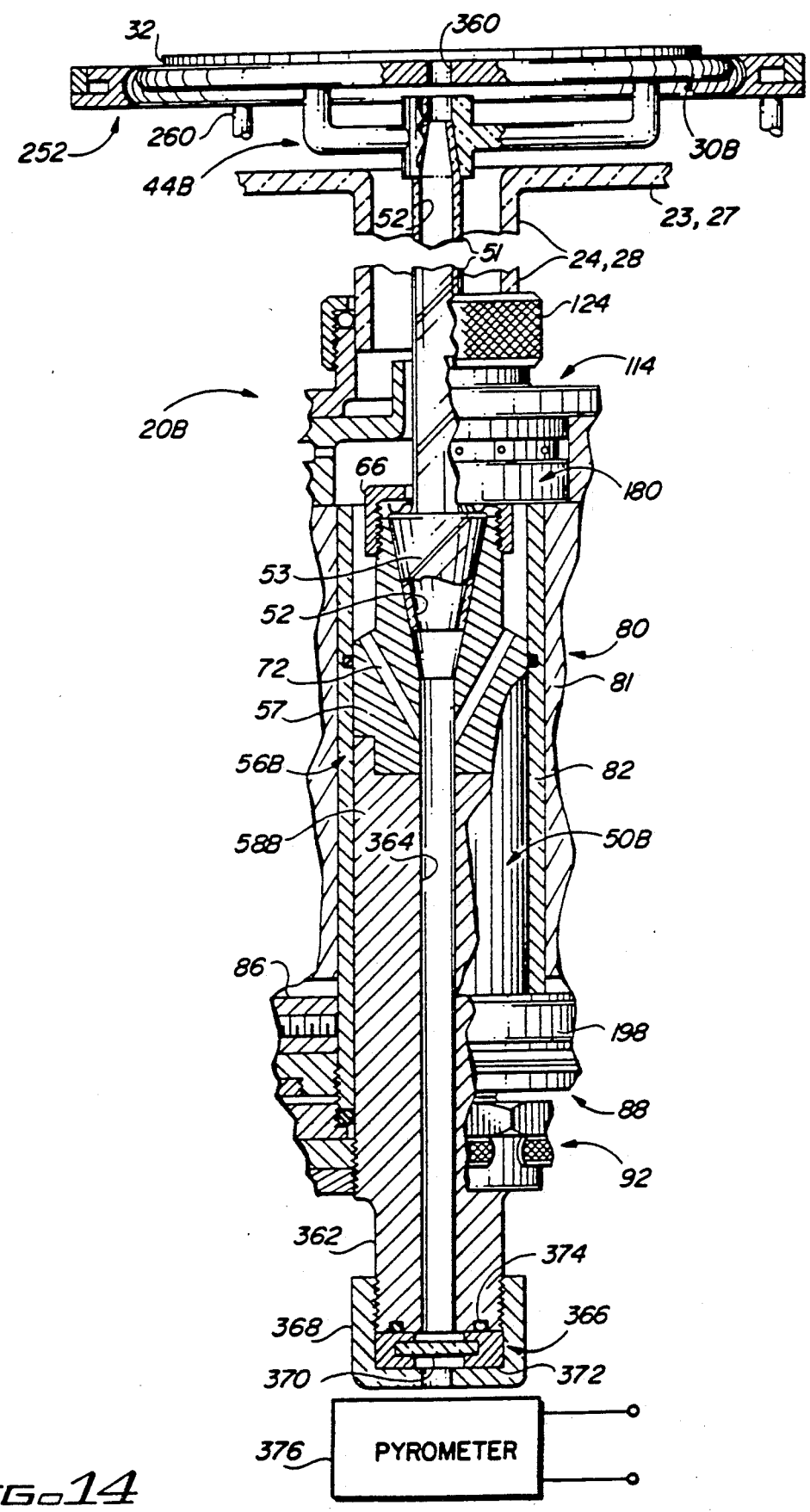
FIG. 14 is a fragmentary view similar to FIG. 3 and showing an alternate temperature sensor embodiment.

Reference is now made to FIG. 14 wherein a modified form of the rotatable substrate supporting mechanism is shown with the modified configuration being indicated in its entirety by the reference numeral 20B. The mechanism 20B, which may be identical to the hereinbefore described mechanisms 20 or 20A with the exception of the changes discussed below, includes a modified susceptor 30B which is provided with a central aperture 360 rather than the blind cavity 144 mentioned in the previous embodiments. The driveshaft assembly 50B includes the rotation shaft 51 with a modified spindle 56B. The spindle 56B includes the upper portion 57 and a modified lower portion 58B which has a depending boss 362 on its lower end which is externally threaded as shown.

The drive shaft assembly 50B defines an axial passage 364 which in this embodiment, is used for the transmission of radiated heat from the center of the substrate 32 and is, therefore left open. The radiated heat enters the axial bore, or passage, 364 through the central aperture 360 of the susceptor 30B, and is transmitted by radiation to a window means 366 which is carried on the depending boss 362 of the drive shaft assembly 50B. A suitable mounting means 368, such as the illustrated nut, is used to mount the window means 366 on the drive shaft assembly for rotation therewith. The window means 366 includes a lens 370 which is formed of a material such as magnesium to the particular wavelength of radiated heat and are not dependent on the temperature for their transparency. The lens 370 is mounted in a suitable ring 372 and is carried by the mounting means 368 with a suitable O-ring gasket 374 is employed to prevent the passage of purge gas around the window means 366. The radiated heat passing through the window means 366 is sensed by a radiation pyrometer 376 of a type well known in the art, which produces an electric signal indicative of the sensed temperature.

While the principles of the invention have now been made clear in the illustrated embodiments, there will be immediately obvious to those skilled in the art, many modifications of structure, arrangements, proportions, the elements, materials and components used in the practice of the invention and otherwise, which are particularly adapted for specific environments and operation requirements without departing from those principles. The appended claims are therefore intended to cover and embrace any such modifications within the limits only of the true spirit and scope of the invention.

What we claim is:

1. A chemical vapor deposition mechanism comprising:
   (a) a reaction chamber defining a reactant gas flow path therethrough and having a bottom surface with a tubular shaft depending therefrom;
   (b) drive shaft means defining a rotational axis, said drive shaft means having a top end disposed in said reaction chamber and depending in spaced coaxial relationship through the tubular shaft to provide an intermediate portion and a lower portion which extends below the tubular shaft of said reaction chamber, said drive shaft means including an axial bore;
   (c) a support plate in downwardly spaced relationship with said reaction chamber and defining an opening coaxial with said drive shaft means;
   (d) mounting means on said support plate attached to the tubular shaft of said reaction chamber, said mounting means defining an axial opening coaxial with the opening of said support plate and through which said drive means axially extends;
   (e) bearing means for supporting and rotatably journaling said drive shaft means;
   (f) drive means coupled to said drive shaft means for rotating said drive shaft means;
   (g) a susceptor defining a top surface for demountably receiving a substrate for deposition purposes in a position wherein the center of the substrate is in a substantially aligned overlaying relationship with the center of said susceptor said susceptor including a blind cavity in the center of its bottom surface;
   (h) temperature sensing means disposed in the axial bore of said drive shaft means and extending therefrom into the blind cavity of said susceptor for sensing the temperature at the center of said susceptor and for producing a signal indicative of the sensed temperature; and (i) spider means disposed on the top end of said drive shaft means for supporting and rotating said susceptor.

2. A mechanism as claimed in claim 1 wherein said temperature sensing means comprises:
(a) an elongated tubular sheath having a closed end and an open end; and
(b) a thermocouple located in the closed end of said sheath, said thermocouple including conductive wires extending therefrom through said tubular sheath and exiting the open end of said sheath.

3. A chemical vapor deposition mechanism comprising;
(a) a reaction chamber defining a reactant gas flow path therethrough and having a bottom surface with a tubular shaft depending therefrom;
(b) drive shaft means defining a rotational axis, said drive shaft means having a top end disposed in said reaction chamber and depending in spaced coaxial relationship through the tubular shaft to provide an intermediate portion and a lower portion which extends below the tubular shaft or said reaction chamber;
(c) a support plate in downwardly spaced relationship with said reaction chamber and defining an opening coaxial with said drive shaft means;
(d) mounting means on said support plate attached to the tubular shaft of said reaction chamber, said mounting means defining an axial opening coaxial with the opening of said support plate and through which said drive means axially extends;
(e) bearing means for supporting and rotatably journaling said drive shaft means;
(f) drive means coupled to said drive shaft means for rotating said drive shaft means;
(g) a susceptor defining a top surface for demountably receiving a substrate for deposition purposes in a position wherein the center of the substrate is in a substantially aligned overlaying relationship with the center of said susceptor;
(h) spider means disposed on the top end of said drive shaft means for supporting and rotating said susceptor;
(i) an elongated tube extending axially upwardly from said mounting means in spaced coaxial relationship with said drive shaft means and in a spaced coaxial position within the tubular shaft, said elongated tube having a top end disposed between the bottom surface of said reaction chamber and said spider means;
(j) stand means attached to the top end of said elongated tube;
(k) ring structure means supported on said stand means in a fixed position concentric with said susceptor; and
(l) at least one temperature sensing means disposed in said ring structure means for sensing the temperature at the periphery of said susceptor and for producing a signal indicative of the sensed temperature.

4. A mechanism as claimed in claim 3 wherein said temperature sensing means comprises:
(a) an elongated tubular sheath having a closed end and an open end; and
(b) a thermocouple located in the closed end of said sheath, said thermocouple including conductive wires extending through said sheath and exiting through the open end of said sheath for conducting the signal from said thermocouple to a point of use.

5. A chemical vapor deposition mechanism comprising:
(a) a reaction chamber defining a reactant gas flow path therethrough and having a bottom surface with a tubular shaft depending therefrom;
(b) drive shaft means defining a rotational axis, said drive shaft means having a top end disposed in said reaction chamber and depending in spaced coaxial relationship through the tubular shaft to provide an intermediate portion and a lower portion which extends below the tubular shaft of said reaction chamber;
(c) a support plate in downwardly spaced relationship with said reaction chamber and defining an opening coaxial with said drive shaft means;
(d) mounting means on said support plate attached to the tubular shaft of said reaction chamber, said mounting means defining an axial opening coaxial with the opening of said support plate and through which said drive means axially extends;
(e) bearing means for supporting and rotatably journaling said drive shaft means;
(f) drive means coupled to said drive shaft means for rotating said drive shaft means;
(g) a susceptor defining a top surface for demountably receiving a substrate for deposition purposes in a position wherein the center of the substrate is in a substantially aligned overlaying relationship with the center of said susceptor;
(h) spider means disposed on the top end of said drive shaft means for supporting and rotating said susceptor;
(i) said susceptor including a central aperture;
(j) said drive shaft means defining an axial bore for receiving radiant heat from the center of the substrate through the aperture of said susceptor and for transmitting the radiant heat through the axial bore of said drive shaft means;
(k) window means associated with said drive shaft means for closing the lower end of the axial bore, said window means being transparent to the wavelengths of the radiant heat transmitted through the axial bore of said drive shaft means; and
(l) a radiation pyrometer for sensing the temperature of the radiant heat transmitted through said window means and for producing a signal indicative of the sensed temperature.

6. A chemical vapor deposition mechanism comprising:
(a) a reaction chamber defining a reactant gas flow path therethrough and having a bottom surface with a tubular shaft depending therefrom;
(b) drive shaft means defining a rotational axis, said drive shaft means having a top end disposed in said reaction chamber and depending in spaced coaxial relationship through the tubular shaft to provide an intermediate portion and a lower portion which extends below the tubular shaft of said reaction chamber;
(c) a support plate in downwardly spaced relationship with said reaction chamber and defining an opening coaxial with said drive shaft means;
(d) mounting means on said support plate attached to the tubular shaft of said reaction chamber, said mounting means defining an axial opening coaxial with the opening of said support plate and through which said drive means axially extends;
(e) bearing means for supporting and rotatably journaling said drive shaft means;
(f) drive means coupled to said drive shaft means for rotating said drive shaft means, said drive means comprising:
   (i) input means for supplying an input signal having a predetermined time duration;
   (ii) a variable speed motor for rotating said drive shaft means;
   (iii) indicator means mounted on said drive shaft means for providing said drive shaft means with a predetermined home position;
   (iv) means responsive to the presence of said input signal for generating a first control signal to operate said motor at a relatively high speed and for terminating said first control signal upon termination of said input signal;
   (v) means responsive to the termination of said first control signal for generating a second control signal to operate said motor at a relatively slower speed; and
   (vi) sensor means responsive to the presence of said second control signal for detecting the home position of said drive shaft means and for terminating said second control signal to stop the operation of said motor and the rotation of said drive shaft means when said drive shaft means is in the home position;
(g) a susceptor defining a top surface for demountably receiving a substrate for deposition purposes in a position wherein the center of the substrate is in a substantially aligned overlaying relationship with the center of said susceptor; and
(h) spider means disposed on the top end of said drive shaft means for supporting and rotating said susceptor.

* * * * *

Disclaimer

4,993,355—*Wiebe B. deBoer*, GB Eersel, Netherlands; Albert. E. Ozias, Aumsville, Oreg. SUSCEPTOR WITH TEMPERATURE SENSING DEVICE. Patent dated Feb. 19, 1991. Disclaimer filed Sept. 3, 1991, by the assignee, Epsilon Technology, Inc.

The term of this patent subsequent to February 19, 2008, has been disclaimed.
*[ Official Gazette November 5, 1991. ]*